United States Patent
Takeda et al.

(10) Patent No.: US 11,236,269 B2
(45) Date of Patent: Feb. 1, 2022

(54) ALPHA-SIALON FLUORESCENT BODY AND LIGHT-EMITTING DEVICE

(71) Applicant: DENKA COMPANY LIMITED, Tokyo (JP)

(72) Inventors: Yusuke Takeda, Omuta (JP); Tomohiro Nomiyama, Omuta (JP); Shintaro Watanabe, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 0 days.

(21) Appl. No.: 17/042,440

(22) PCT Filed: Mar. 19, 2019

(86) PCT No.: PCT/JP2019/011619
§ 371 (c)(1),
(2) Date: Sep. 28, 2020

(87) PCT Pub. No.: WO2019/188630
PCT Pub. Date: Oct. 3, 2019

(65) Prior Publication Data
US 2021/0079298 A1 Mar. 18, 2021

(30) Foreign Application Priority Data
Mar. 29, 2018 (JP) .............................. JP2018-064665

(51) Int. Cl.
*C09K 11/79* (2006.01)
*C09K 11/77* (2006.01)
*C09K 11/08* (2006.01)

(52) U.S. Cl.
CPC ...... *C09K 11/7734* (2013.01); *C09K 11/0883* (2013.01); *C09K 11/7721* (2013.01); *C09K 11/7792* (2013.01)

(58) Field of Classification Search
CPC ........ C09K 11/77348; C09K 11/77347; C09K 11/77346; C09K 11/7734
USPC ......................................................... 313/503
See application file for complete search history.

(56) References Cited

U.S. PATENT DOCUMENTS

| | | | |
|---|---|---|---|
| 2003/0030368 A1 | 2/2003 | Ellens et al. | |
| 2004/0155225 A1 | 8/2004 | Yamada et al. | |
| 2007/0248519 A1* | 10/2007 | Mitomo | C01B 21/0826 423/263 |
| 2008/0258602 A1* | 10/2008 | Masuda | H01L 33/507 313/487 |
| 2009/0014741 A1* | 1/2009 | Masuda | C04B 35/597 257/98 |
| 2009/0091237 A1 | 4/2009 | Hirosaki et al. | |
| 2009/0284948 A1 | 11/2009 | Yamao et al. | |
| 2010/0072498 A1* | 3/2010 | Xie | C09K 11/7734 257/98 |
| 2010/0085728 A1* | 4/2010 | Seto | C09K 11/7706 362/84 |
| 2011/0305005 A1 | 12/2011 | Tsukatani et al. | |
| 2015/0035430 A1 | 2/2015 | Yoshida et al. | |
| 2016/0280993 A1 | 9/2016 | Emoto | |
| 2016/0280994 A1 | 9/2016 | Emoto | |
| 2017/0166810 A1 | 6/2017 | Morikawa et al. | |
| 2020/0095501 A1 | 3/2020 | Ichikawa et al. | |

FOREIGN PATENT DOCUMENTS

| | | |
|---|---|---|
| JP | H08-339761 A | 12/1996 |
| JP | 2003-124527 A | 4/2003 |
| JP | 2004-238505 A | 8/2004 |
| JP | 3668770 B2 | 7/2005 |
| JP | 2005-307012 A | 11/2005 |
| JP | 2006-028295 A | 2/2006 |
| JP | 2006-269938 A | 10/2006 |
| JP | 2012-036408 A | 2/2012 |
| JP | 2013-127076 A | 6/2013 |
| JP | 2016-191057 A | 11/2016 |
| JP | 2017-110206 A | 6/2017 |
| JP | 6212498 B2 | 10/2017 |
| JP | 6273394 B1 | 1/2018 |
| WO | 2007/004493 A1 | 1/2007 |
| WO | 2012/046288 A1 | 4/2012 |
| WO | 2014/077240 A1 | 5/2014 |

OTHER PUBLICATIONS

Ken Sakuma et al.; "Warm-white light-emitting diode with yellowish orange SiAlON ceramic phosphor"; Optics Letters; Sep. 2004; vol. 29; No. 17; pp. 2001-2003.

Oct. 8, 2020 International Preliminary Report on Patentability issued in International Patent Application No. PCT/JP2019/011619.

May 7, 2019 International Search Report issued in International Patent Application No. PCT/JP2019/011619.

* cited by examiner

*Primary Examiner* — Christopher M Raabe
(74) *Attorney, Agent, or Firm* — Oliff PLC

(57) ABSTRACT

An α-sialon phosphor represented by general formula: $M_xEu_y(Si,Al)_{12}(O,N)_{16}$, where M represents at least one or more elements selected from Li, Mg, Ca, Y and a lanthanoid (excluding La and Ce), 0<x, and 0<y, where the phosphor includes, as a host crystal, a crystal structure identical to that of an α-sialon crystal phase, and the phosphor has a bulk density of 1.00 g/cm³ or more and 1.80 g/cm³ or less. Also provided is a light-emitting element including the α-sialon phosphor and a semiconductor light-emitting element capable of exciting the α-sialon phosphor.

8 Claims, No Drawings

ALPHA-SIALON FLUORESCENT BODY AND LIGHT-EMITTING DEVICE

TECHNICAL FIELD

The invention relates to an α-sialon phosphor that is excited by light of a wavelength of ultraviolet light to blue light to thereby emit yellow to orange light, and a light-emitting apparatus utilizing the phosphor.

BACKGROUND ART

α-Sialon phosphors as nitride or oxynitride phosphors are known to be excellent in not only efficiency of fluorescent emission, but also temperature characteristics. In particular, an α-sialon phosphor where europium is activated is excited by light in a wide wavelength range from ultraviolet light to blue light to thereby emit yellow to orange light, and thus is studied about an application to a yellow phosphor as an alternative of YAG:Ce or to a phosphor for a light bulb color LED (Light Emitting Diode) low in color temperature (Patent Literature 1 and 2, and Non Patent Literature 1).

α-Sialon has a structure where some Si—N bonds in an α-silicon nitride crystal are replaced with an Al—N bond and an Al—O bond, and specified elements (Ca, and Li, Mg, Y or a lanthanoid excluding La and Ce) penetrate in the form of solid solutions between crystal lattices in order to keep electroneutrality. Such elements which penetrate in the form of solid solutions are partially elements serving as light emission centers, and thus fluorescence characteristics are exhibited. Examples of a method for obtaining an α-sialon phosphor include a method involving heat-treating a mixed powder including silicon nitride, aluminum nitride and an oxide (encompassing a compound which is heat-treated and thus is in the form of an oxide) of an element which penetrates in the form of a solid solution including a light emission center, in a nitrogen atmosphere. Such a synthetic method uses an oxide raw material, and thus provides an α-sialon phosphor naturally including a solid solution of oxygen at a certain level. In particular, the emission color of an α-sialon phosphor including a solid solution of Ca excellent in fluorescence characteristics and Eu as a light emission center is yellow (fluorescence peak wavelength of around 580 nm) in this case.

On the contrary, an α-sialon phosphor low in content of oxygen, synthesized by use of calcium nitride as a calcium raw material, can be in the form of a solid solution with a higher concentration of calcium than that of the above conventional α-sialon phosphor. In particular, when the concentration of a solid solution of Ca is high, a phosphor is obtained which has a fluorescence peak wavelength (590 nm or more) higher than the wavelength with respect to a conventional composition using an oxide raw material (Patent Literature 3 and 4).

An α-sialon phosphor is disclosed which is in the form of a solid solution of Li, in which $Li^+$ is used as a metal ion for stabilization of a structure, and a phosphor is obtained which has a high efficiency of light emission by setting the content of oxygen and the content of europium as a light emission center in specified ranges (Patent Literature 5 and 6).

CITATION LIST

Patent Literature

Patent Literature 1: Japanese Patent No. 3668770
Patent Literature 2: Japanese Patent Laid-Open No. 2003-124527
Patent Literature 3: Japanese Patent Laid-Open No. 2005-307012
Patent Literature 4: Japanese Patent Laid-Open No. 2006-28295
Patent Literature 5: International Publication No. WO2007/004493
Patent Literature 6: Japanese Patent No. 6212498

Non Patent Literature

Non Patent Literature 1: Ken Sakuma et al. "Warm-white light-emitting diode with yellowish orange SiAlON ceramic phosphor", OPTICS LETTERS, 29(17), 2001-2003 (2004)

SUMMARY OF INVENTION

Technical Problem

Light-emitting apparatuses such as backlight and illumination for liquid crystal displays are always demanded to be improved in light-emitting characteristics, thus each member thereof is required to be enhanced in characteristics, and phosphors for use in LEDs are also demanded to be improved in light-emitting characteristics. There is also a demand for an improvement in yield of LED products by not only improvements in light-emitting characteristics by themselves, but also, for example, an improvement in production accuracy so that variations in light-emitting characteristics of white LEDs for individual products are reduced.

Solution to Problem

An object of the invention is to provide an α-sialon phosphor which can allow a light-emitting element, for example, a white LED to be more stably produced and which can allow the variation among LED products particularly with respect to chromaticity (also simply referred to as variation in chromaticity) to be suppressed. The inventors have made intensive studies for solving the above problems, and as a result, have found that a light-emitting element, for example, a white LED, more suppressed in variation in chromaticity, can be produced by controlling the bulk density of an α-sialon phosphor in a specified range.

That is, embodiments of the invention can provide the following aspects.

(1) An α-sialon phosphor represented by general formula: $M_xEu_y(Si,Al)_{12}(O,N)_{16}$,
wherein M represents at least one or more elements selected from Li, Mg, Ca, Y and a lanthanoid (excluding La and Ce), $0<x$, and $0<y$,
wherein the phosphor includes, as a host crystal, a crystal structure identical to that of an α-sialon crystal phase, wherein the phosphor has a bulk density of 1.00 $g/cm^3$ or more and 1.80 $g/cm^3$ or less.

(2) The α-sialon phosphor according to (1), having an angle of repose of 60° or less.

(3) The α-sialon phosphor according to (1) or (2), wherein M in the general formula is Ca, and relationships of $1.0 \leq x+y \leq 2.2$ and $0<y \leq 0.2$ are satisfied.

(4) The α-sialon phosphor according to (1) or (2), wherein M in the general formula is Li, and relationships of $1.0 \leq x+y \leq 2.0$ and $0<y \leq 0.2$ are satisfied.

(5) The α-sialon phosphor according to any one of (1) to (4), having an angle of repose of 30° or more.

(6) The α-sialon phosphor according to any one of (1) to (5), having an angle of repose of 55° or less.

(7) A light-emitting element including the α-sialon phosphor according to any one of (1) to (6), and a light-emitting semiconductor element capable of exciting the α-sialon phosphor.

(8) A light-emitting apparatus including the light-emitting element according to (7).

Advantageous Effects of Invention

An α-sialon phosphor which can be provided according to an embodiment of the invention, having a bulk density in a specified range, can be combined with a semiconductor light-emitting element capable of exciting the α-sialon phosphor, thereby forming a light-emitting element, and can allow, for example, a light-emitting element suppressed in variations in light-emitting characteristics typified by chromaticity of a white LED and more stabilized in light-emitting characteristics to be provided. Furthermore, an embodiment of the invention can provide a light-emitting apparatus including the light-emitting element and an instrument receiving the light-emitting element. Examples of the light-emitting apparatus include an illumination apparatus, a backlight apparatus, an image display apparatus and a signal apparatus.

DESCRIPTION OF EMBODIMENT

Hereinafter, modes for carrying out the invention will be described in detail. Any numerical value range herein includes the upper limit value and the lower limit value thereof, unless particularly noted.

An α-sialon phosphor according to an embodiment of the invention is an α-sialon phosphor which is represented by general formula: $M_xEu_y(Si,Al)_{12}(O,N)_{16}$ (wherein M represents at least one or more elements selected from Li, Mg, Ca, Y and a lanthanoid (excluding La and Ce)), which encompasses all phosphors each having, as a host crystal, a crystal structure identical to that of an α-sialon crystal phase and which has a bulk density of 1.00 g/cm³ or more and 1.80 g/cm³ or less.

The α-sialon phosphor is a solid solution where some Si—N bonds in α-silicon nitride are replaced with an Al—N bond and an Al-0 bond and any particular cation penetrates into a lattice in order to keep electroneutrality, and the α-sialon phosphor of the invention is represented by general formula: $M_xEu_y(Si,Al)_{12}(O,N)_{16}$. M in the general formula is an element which can penetrate into a lattice, and Li, Mg, Ca, Y and a lanthanoid (excluding La and Ce) are generally selected. The x value as the amount of a solid solution of M is a numerical value determined by the rate of replacement of a Si—N bond with an Al—N bond, and satisfies 0<x. In particular, use of Ca or Li as M is preferable because the host crystal of α-sialon is stabilized in a wide composition range. In such a case, 0.9≤x<2.2 is more preferable, and 1.4<x<1.8 is still more preferable.

It is necessary for allowing α-sialon to exhibit fluorescence characteristics that additionally M represented in the general formula be partially an element capable of being in the form of a solid solution and of serving as a light emission center, and Eu serving as a light emission center is selected for such a part to thereby provide a phosphor which is excited by light in a wide wavelength range from ultraviolet to blue to thereby exhibit emission of yellow to orange visible light. Accordingly, the y value as the amount of a solid solution of Eu in the general formula satisfies 0<y.

The emission wavelength is varied depending on the composition of a solid solution of the α-sialon phosphor, namely, the respective rates of replacement of Si—N bonds with Al—N and Al—O bonds (designated as m value and n value, respectively) and the concentration of a solid solution of Eu. While the emission wavelength is shifted to a longer wavelength by an increase in concentration of a solid solution of Eu as a light emission center, the degree of such shifting is low and is accompanied by the change in intensity of light emission, and therefore is unfitted for a control factor. Eu in the form of a solid solution in a lattice of the α-sialon phosphor is present as a divalent cation, excitation and fluorescence thereof are due to 4f-5d transition, and the emission wavelength is largely affected by the coordination environment of $Eu^{2+}$. Accordingly, the composition of a solid solution of the α-sialon phosphor can be controlled to thereby control a wide range of emission wavelength with the intensity of light emission being maintained.

The composition of a solid solution of the α-sialon phosphor is represented by x and y in general formula: $M_xEu_y(Si,Al)_{12}(O,N)_{16}$, and the Si/Al ratio and the O/N ratio associated therewith. An α-sialon phosphor commonly synthesized has a second crystal phase different from that of α-sialon and an amorphous phase inevitably present, and the composition of a solid solution thereof cannot be thus strictly defined by composition analysis or the like. The crystal phase present in the phosphor is preferably an α-sialon single phase, and may include a trace amount of, for example, a crystal phase of β-sialon, aluminum nitride, and polytypoid thereof as long as light-emitting characteristics are not affected.

The phosphor of the invention is represented by general formula: $M_xEu_y(Si,Al)_{12}(O,N)_{16}$, examples of such an element represented by M include Li, Mg, Ca, Y and a lanthanoid (excluding La and Ce), and the element preferably includes Li and Ca, and is further preferably Li alone or Ca alone.

When the element represented by M is Ca alone, the respective amounts x and y of solid solutions of a Ca element and an Eu element in general formula: $Ca_xEu_y(Si,Al)_{12}(O,N)_{16}$ preferably satisfy the following: x+y is in the range of 1.0 to 2.2 and y is more than 0 and equal to or less than 0.2; in order that favorable light-emitting characteristics are achieved.

When the element represented by M is Li alone, the respective amounts x and y of solid solutions of a Li element and an Eu element in general formula: $Li_xEu_y(Si,Al)_{12}(O,N)_{16}$ preferably satisfy the following: x+y is in the range of 1.0 to 2.0 and y is more than 0 and equal to or less than 0.2; in order that favorable light-emitting characteristics are achieved.

A typical method for forming a LED by combining a semiconductor light-emitting element for excitation and a phosphor, here adopted, is, for example, a method involving preparing a composition where a phosphor powder is finely dispersed in a curable silicone resin, potting the composition onto a semiconductor light-emitting element, and then curing the resin, and the differences in powder characteristics of the phosphor and the difference in fine dispersing state into the resin may here occur and sometimes have any influence on the variations in light-emitting characteristics of the resulting LED. The present inventors have found that the variations in light-emitting characteristics of a LED are directly affected particularly by the bulk density of an α-sialon phosphor, thereby leading to completion of the invention.

An α-sialon phosphor which can be provided according to an embodiment of the invention has a bulk density of 1.00 g/cm$^3$ or more and 1.80 g/cm$^3$ or less. A bulk density of less than 1.00 g/cm$^3$ or more than 1.80 g/cm$^3$ causes an increase in variation in chromaticity of any LED made by use of the phosphor.

In general, the bulk density of a powder can be determined according to a method involving measuring the volume of a known weight of a powder sample loaded in a measuring cylinder (method 1), a method involving measuring the mass of a known volume of a powder sample loaded in a container, through a volumeter (method 2), or a method of measurement by use of a dedicated container for measurement (method 3). In particular, the method 1 and the method 3 are desirably used. Hereinafter, the method 3 will be described in detail. First, a sample is provided in an amount sufficient for measurement. A dry cylindrical container for measurement, having a constant volume, is equipped with an auxiliary cylinder, and a required amount of the sample is loaded therein. Such a container for measurement, equipped with an auxiliary cylinder, is tapped several times at 50 to 60 times/min. The auxiliary cylinder is removed, an excess powder is scraped off from the upper surface of the container, and the weight is measured. The mass of an empty cylindrical container, measured in advance, is subtracted, and thus the mass of the resulting powder is measured. The weight per unit volume of the sample is calculated, and thus the bulk density is determined. The bulk density is preferably repeatedly measured, more preferably measured multiple times and determined as the average value of such measurement values.

The bulk density of a powder can be generally controlled by the grain size, the grain size distribution and the surface state of the powder.

An α-sialon phosphor provided by an embodiment of the invention preferably has a mass median size (D50) of 40 μm or less, as measured according to a laser diffraction scattering method. A mass median size of 40 or less can allow the bulk density to fall within a specified range and can reduce the variation in chromaticity of a LED made by use of the phosphor. A mass median size of 5 μm or more is also preferable because light-emitting characteristics of the phosphor are enhanced. The mass median size is here the value obtained by conversion and calculation from the volume median size obtained from the cumulative distribution curve measured by a laser diffraction scattering method according to JIS R1622:1995 and R1629:1997.

An α-sialon phosphor according to an embodiment of the invention further preferably has a span value of 1.5 or less, further preferably 0.1 or more and 1.4 or less. The span value here means the value calculated by (D90-D10)/D50, and the D10 and D90 here mean 10% size and 90% size, respectively, obtained from the cumulative distribution curve on a mass basis, measured in the same manner as in the above mass median size. The span value serves as an index representing the distribution width of the grain size distribution, namely, the variation in size of a grain of the α-sialon phosphor. A smaller span value allows the bulk density to more easily fall within a specified range and can reduce the variation in chromaticity of a LED made by use of the phosphor.

The surface state of a powder can be changed depending on a post-treatment method in production. Examples of the post-treatment method of the α-sialon phosphor include washing, and covering of the surface of a phosphor grain, and washing is preferable from the viewpoint of enhancements in productivity and bulk density. The washing method is not particularly limited, and the phosphor is preferably washed with an aqueous acidic, alkaline, or polar solution, and may be washed with one aqueous washing solution or may be washed with two or more aqueous washing solutions multiple times.

An α-sialon phosphor according to an embodiment of the invention preferably has an angle of repose of 30° or more, preferably and angle of repose of 60° or less, more preferably 55° or less. The angle of repose represents the fluidity of the phosphor, and thus serves as an index representing the degree of dispersion of the phosphor used in a LED. An angle of repose of 30° or more and 60° or less can reduce the variation in chromaticity of a LED produced.

Examples of the method for measuring the angle of repose include a method involving measuring the angle created by a powder in free fall of a sample loaded in a container and deposition thereof on a horizontal surface (injection method); a method involving allowing a sample to free fall through a small hole in a container bottom and measuring the angle created by a powder remaining the container (discharge method); and a method involving loading a powder in a container, inclining the container and measuring the angle created by the powder (gradient method). In particular, the injection method is desirably used. Hereinafter, the injection method will be described in detail. A sample is allowed to fall from a funnel at a certain height, onto a horizontal substrate, a basic angle is calculated from the diameter and the height of a conical deposited article produced, and the basic angle is defined as the angle of repose. The angle of repose is preferably repeatedly measured, more preferably measured multiple times and determined as the average value of such measurement values.

Method for Producing α-Sialon Phosphor

The method for producing an α-sialon phosphor according to an embodiment of the invention is not particularly limited. A method is here exemplified which involves firing a raw material-mixed powder capable of forming a compound represented by the general formula, in a determined temperature range in a nitrogen atmosphere.

In the production method, any nitride of each constituent element, namely, calcium nitride, lithium nitride, silicon nitride, aluminum nitride or europium nitride is suitably used as a raw material. Any oxide and/or carbonate of such each constituent element can also be used. For example, an easily available europium oxide may be used as a europium source serving as a light emission center.

The method for mixing the above-mentioned raw materials is not particularly limited, and calcium nitride, lithium nitride, and europium nitride which react violently with moisture and oxygen in the air are suitably handled in a glove box in which the atmosphere is replaced with an inert atmosphere.

The firing container is preferably formed from any material which is stable in a nitrogen atmosphere at a high temperature and which hardly reacts with the raw material-mixed powder and a reaction product thereof, and examples thereof include a container made of boron nitride, a container made of a high melting point metal, and a container made of carbon.

The firing container filled with the raw material-mixed powder is taken out from the glove box and rapidly installed in a firing furnace, and the powder is fired at 1600° C. or more and 2100° C. or less in a nitrogen atmosphere. A too low firing temperature causes an increase in amount of remaining of an unreacted substance, and a too high firing temperature is not preferable because a main phase having a crystal structure identical to that of α-sialon is degraded.

The firing time is selected in such a way as to fall within a time range which does not cause any failure, for example, the presence of a large amount of an unreacted substance, insufficient grain growth, or deterioration in productivity, and is preferably 2 hours or more and 24 hours or less.

The pressure of the firing atmosphere is selected depending on the firing temperature. While the α-sialon phosphor of the invention can be stably present at the atmospheric pressure at a temperature of up to about 1800° C., a pressurized atmosphere is required at a temperature equal to or more than that temperature in order to suppress degradation of the phosphor. The higher the atmosphere pressure is, the higher the degradation temperature of the phosphor is, and the pressure is preferably less than 1 MPa in consideration of industrial productivity.

The state of a fired product is varied and is in the form of a powdery, clumped, or sintered body depending on compounding of the raw materials and the firing conditions. In the case of use as a phosphor, the fired product is formed into a powder having a determined size, by combining crushing, pulverizing and/or classification operation(s).

A washing step is preferably provided after a pulverizing step in a method for producing an α-sialon phosphor according to an embodiment of the invention. The aqueous solution for use in the washing step is preferably an aqueous acidic, alkaline, or polar solution, as described above. The washing step is a step of dispersing the phosphor after the pulverizing step, in the above-mentioned aqueous solution, and stirring the resultant for several minutes to several hours. The washing step can dissolve and remove any impurity element derived from the firing container, a different phase generated in the firing step, any impurity element included in the raw materials, and any impurity element incorporated in the pulverizing step, and can clean the surface of the phosphor, resulting in an enhancement in bulk density of the resulting phosphor powder.

The α-sialon phosphor can be combined with a semiconductor light-emitting element capable of exciting such a phosphor, thereby forming a light-emitting element, and furthermore also providing a light-emitting apparatus including the light-emitting element. The α-sialon phosphor can be irradiated particularly with ultraviolet light or visible light of a wavelength of 350 nm or more and 500 nm or less, from the semiconductor light-emitting element, thereby providing a yellow to orange light-emitting element, and the light-emitting element can be used to provide, for example, a light-emitting apparatus for an automobile blinker. The α-sialon phosphor of the invention is combined with a semiconductor light-emitting element such as an ultraviolet LED or a blue LED, and furthermore the combination is, if necessary, combined with other phosphor emitting green to yellow light, a red phosphor, and/or a blue phosphor, thereby providing a light-emitting element which easily emits white light.

EXAMPLES

Examples of the invention will be described in detail with reference to Table 1. Table 1 shows the D10, D50, D90, span value, bulk density, and angle of repose of each phosphor of Examples and Comparative Examples.

TABLE 1

| | Element represented by M | General formula | | Grain size distribution (μm) | | | Span value | Bulk density (g/cm³) | Angle of repose |
|---|---|---|---|---|---|---|---|---|---|
| | | x | y | D10 | D50 | D90 | | | |
| Example 1 | Ca | 1.71 | 0.04 | 8.8 | 15.7 | 26.7 | 1.14 | 1.41 | 53° |
| Example 2 | Ca | 1.71 | 0.04 | 14.6 | 24.7 | 40.5 | 1.05 | 1.56 | 45° |
| Example 3 | Ca | 1.71 | 0.04 | 18.6 | 35.7 | 64.8 | 1.29 | 1.62 | 46° |
| Example 4 | Ca | 1.71 | 0.04 | 3.1 | 6.9 | 13.0 | 1.43 | 1.10 | 43° |
| Example 5 | Li | 1.73 | 0.02 | 10.0 | 17.8 | 33.2 | 1.30 | 1.05 | 48° |
| Comparative Example 1 | Ca | 1.71 | 0.04 | 28.1 | 54.0 | 127.0 | 1.83 | 1.91 | 61° |
| Comparative Example 2 | Ca | 1.71 | 0.04 | 3.1 | 6.8 | 13.2 | 1.49 | 0.85 | 56° |
| Comparative Example 3 | Li | 1.73 | 0.02 | 2.5 | 5.9 | 13.9 | 1.93 | 0.78 | 58° |

Example 1

An α-silicon nitride powder ($Si_3N_4$, SN-E10 grade manufactured by Ube Industries, Ltd.), a calcium nitride powder ($Ca_3N_2$, manufactured by Materion Corporation), an aluminum nitride powder (AlN, E grade manufactured by Tokuyama Corporation) and europium oxide ($Eu_2O_3$, RU grade manufactured by Shin-Etsu Chemical Co., Ltd.), as raw materials of a phosphor of Example 1, were used at a ratio of Ca:Eu:Si:Al=1.71:0.04:8.50:3.50.

First, $Si_3N_4$, AlN and $Eu_2O_3$ among the raw materials were dry mixed by a V-type mixing machine for 10 minutes. The raw materials after mixing were classified by a nylon sieve having an aperture of 250 μm in order to uniform the sizes of the raw materials after mixing, thereby providing a raw material mixture.

The raw material mixture which passed through the sieve was transferred to a glove box capable of keeping a nitrogen atmosphere having a moisture content of 1 ppm by mass or less and an oxygen content of 1 ppm by mass or less, $Ca_3N_2$ was here compounded into the raw material mixture, and the resultant was dry mixed. The resultant was again classified by a nylon sieve having an aperture of 250 μm in order to uniform the sizes of the raw materials dry mixed. A cylindrical container equipped with a lid and made of boron nitride (N-1 grade manufactured by Denka Company Limited) was filled with 120 g of the raw materials after classification.

The container filled with the raw materials was taken out from the glove box and rapidly installed in an electric furnace of a carbon heater, and the inside of the furnace was sufficiently evacuated to a vacuum of 0.1 Pa or less. Heating was started under evacuation to vacuum, a nitrogen gas was introduced at 650° C., and the atmosphere pressure in the furnace was 0.1 MPa. The temperature was then raised to 1850° C. also after gas introduction, and firing at 1850° C. was performed for 20 hours.

After cooling, a sample recovered from the furnace was an orange clumped product, crushed in a mortar, and was finally allowed to fully pass through a sieve having an aperture of 150 μm.

The resulting phosphor sample was subjected to powder X-ray diffraction using CuKα-ray by use of an X-ray diffraction apparatus (UltimaIV manufactured by Rigaku Corporation). The same diffraction pattern as that of an α-sialon crystal phase was observed in the resulting X-ray diffraction pattern.

The sample which passed through the sieve was immersed in a mixed acid of hydrofluoric acid and nitric acid for 1 hour, and washing was performed. After the washing, filtration was performed to separate a phosphor and a treatment liquid. The phosphor was dried in a dryer at 100° C. to 120° C. for 12 hours, the phosphor after drying was classified by a sieve having an aperture of 150 μm, and only the phosphor which passed through the sieve was collected.

Method for Measuring Mass Median Size and Span Value

The mass median size and the pan value were obtained by calculating D10, D50 (mass median size), and D90 from the volume average size measured by a laser diffraction scattering method according to JIS R1622:1995 and R1629:1997 by use of a grain size distribution measurement apparatus (Microtrac MT3000II manufactured by MicrotracBEL Corp.), and determining the span value, (D90-D10)/D50.

Method for Measuring Bulk Density

The bulk density was measured according to the following method. A cylindrical container as a constant-volume container (25 cc) was used for a container for measurement, and the mass thereof was measured by a scale. The container for measurement was equipped with an auxiliary cylinder, a sample was loaded until overflow, such a container for measurement, equipped with an auxiliary cylinder, was tapped fifty times at 50 to 60 times/minute, and the auxiliary cylinder was removed. The sample put over the upper end portion of the container for measurement was leveled off by using a leveling plate. The leveling plate was here used with being inclined backward from the direction of leveling off so that no powder was compressed. The mass of the resultant together with the container for measurement was measured by a scale, the mass of the container for measurement was subtracted therefrom, and the mass of the sample was thus calculated. The measurement was performed three times. The average value with respect to the value obtained by dividing the mass of the sample, as calculated in such each measurement, by the volume of the container for measurement was calculated as the bulk density.

Method for Measuring Angle of Repose

The angle of repose was measured according to the following method. The low angle was calculated from the diameter and the height of a conical deposited product produced by allowing 20 g of a sample to fall onto a substrate from a height of 2 to 4 cm, corresponding to the height of the upper edge of a commercially available glass funnel where the inner diameter of a nozzle was 10 mm, through the funnel at a rate per minute of 20 to 60 g. The measurement was performed three times, and the average value with respect to the low angle was defined as the angle of repose.

Examples 2 and 3

Each phosphor powder of Examples 2 and 3 was produced under the same conditions as in Example 1 except that the pulverization and classification conditions were changed such that D10, D50 (mass median size), and D90 were as shown in Table 1. Characteristics of each of the phosphors obtained in Examples 2 to 3, together with those in Example 1, are shown in Table 1.

Example 4

A phosphor powder of Example 4 was produced under the same conditions as in Example 1 except that the pulverization and classification conditions were changed such that D10, D50 (mass median size), and D90 were as shown in Table 1 and washing with an aqueous ethanol solution was added after the acid washing. Characteristics of the phosphor obtained in Example 4 are also collectively shown in Table 1.

Example 5

An α-silicon nitride powder ($Si_3N_4$, SN-E10 grade manufactured by Ube Industries, Ltd.), a lithium nitride powder ($Li_3N$, manufactured by Materion Corporation), an aluminum nitride powder (AlN, E grade manufactured by Tokuyama Corporation) and europium oxide ($Eu_2O_3$, RU grade manufactured by Shin-Etsu Chemical Co., Ltd.), as raw materials of a phosphor of Example 5, were used at a ratio of Li:Eu:Si:Al=1.73:0.02:10.25:1.75.

First, $Si_3N_4$, AlN and $Eu_2O_3$ among the raw materials were dry mixed by a V-type mixing machine for 10 minutes. The raw materials after mixing were classified by a nylon sieve having an aperture of 250 μm in order to uniform the sizes of the raw materials after mixing, thereby providing a raw material mixture.

The raw material mixture which passed through the sieve was transferred to a glove box capable of keeping a nitrogen atmosphere having a moisture content of 1 ppm by mass or less and an oxygen content of 1 ppm by mass or less, $Li_3N$ was here compounded into the raw material mixture, and the resultant was dry mixed. The resultant was again classified by a nylon sieve having an aperture of 250 μm in order to uniform the sizes of the raw materials dry mixed. A cylindrical container equipped with a lid and made of boron nitride (N-1 grade manufactured by Denka Company Limited) was filled with 200 g of the raw materials after classification.

The container filled with the raw materials was taken out from the glove box and rapidly installed in an electric furnace of a carbon heater, and the inside of the furnace was sufficiently evacuated to a vacuum of 0.1 Pa or less. Heating was started with evacuation to vacuum, a nitrogen gas was introduced at 650° C., and the atmosphere pressure in the furnace was 0.8 MPa. The temperature was then raised to 1800° C. also after gas introduction, and firing at 1800° C. was performed for 4 hours.

After cooling, a sample recovered from the furnace was an orange clumped product, crushed in a mortar, and finally allowed to fully pass through a sieve having an aperture of 150 μm.

The resulting phosphor sample was subjected to powder X-ray diffraction using CuKα-ray by use of an X-ray diffraction apparatus (UltimaIV manufactured by Rigaku Corporation). The same diffraction pattern as that of an α-sialon crystal phase was observed in the resulting X-ray diffraction pattern.

The sample which passed through the sieve was immersed in a mixed acid of hydrofluoric acid and nitric acid for 1 hour, and washing was performed. After the washing, filtration was performed to separate a phosphor and a treatment liquid. The phosphor was dried in a dryer at 100° C. to 120° C. for 12 hours, the phosphor after drying was classified by a sieve having an aperture of 150 μm, and only the phosphor which passed through the sieve was collected.

The resulting phosphor sample was subjected to the same measurement of powder characteristics, as in each of the phosphors obtained in Examples 1 to 4. The results are shown in Table 1.

Comparative Example 1

A phosphor powder of Comparative Example 1 was produced under the same conditions as in Example 1 except that the pulverization and classification conditions were changed such that D10, D50 (mass median size), and D90 were as shown in Table 1. Characteristics of the phosphor obtained in Comparative Example 1, together with those in Examples 1 to 5, are shown in Table 1.

Comparative Example 2

A phosphor powder of Comparative Example 2 was produced under the same conditions as in Example 4 except that no washing with an aqueous ethanol solution was performed after the acid washing. Characteristics of the phosphor obtained in Comparative Example 2, together with those in Examples 1 to 5 and Comparative Example 1, are shown in Table 1.

Comparative Example 3

A phosphor powder of Comparative Example 3 was produced under the same conditions as in Example 5 except that the pulverization and classification conditions were changed such that D10, D50 (mass median size), and D90 were as shown in Table 1. Characteristics of the phosphor obtained in Comparative Example 3, together with those in Examples 1 to 5 and Comparative Examples 1 to 2, are shown in Table 1.

Production of LED

Example 6

A LED was produced by using the α-sialon phosphor obtained in Example 1. In other words, 10% by mass of the phosphor grain was added to a silicone resin (trade name: KER6150 manufactured by Shin-Etsu Chemical Co., Ltd.) having thermosetting properties and having fluidity at ordinary temperature, and stirred and mixed to prepare slurry. Next, 6 mg of the slurry was injected to a top view type package where a blue LED chip having a peak at a wavelength of 450 to 460 nm was mounted, and thereafter the slurry was heated and cured at a temperature of 150° C. for 2 hours. Thus, a LED was produced which included the α-sialon phosphor grain of Example 1 and which could absorb light of a wavelength in the range of 420 to 480 nm and emit light of a wavelength in the range of more than 480 nm and 800 nm or less.

Example 7

A LED was produced under the same conditions as in Example 6 except that the α-sialon phosphor grain obtained in Example 2 was used.

Example 8

A LED was produced under the same conditions as in Example 6 except that the α-sialon phosphor grain obtained in Example 3 was used.

Example 9

A LED was produced under the same conditions as in Example 6 except that the α-sialon phosphor grain obtained in Example 4 was used.

Example 10

A LED was produced under the same conditions as in Example 6 except that the α-sialon phosphor grain obtained in Example 5 was used.

Comparative Example 4

A LED was produced under the same conditions as in Example 6 except that the α-sialon phosphor grain obtained in Comparative Example 1 was used.

Comparative Example 5

A LED was produced under the same conditions as in Example 6 except that the α-sialon phosphor grain obtained in Comparative Example 2 was used.

Comparative Example 6

A LED was produced under the same conditions as in Example 6 except that the α-sialon phosphor grain obtained in Comparative Example 3 was used.

Evaluation of Light-Emitting Characteristics of LED

Fifty LEDs were produced with respect to each of those produced in Examples 6 to 10 and Comparative Examples 4 to 6, and subjected to measurement for chromaticity evaluation by use of a LED measurement apparatus (trade name: CAS140B, manufactured by Instrument System). The results were summarized in Table 2 shown below. The chromaticity evaluation here indicated the respective standard deviations σ of the x value (chromaticity x) and the y value (chromaticity y) of the XYZ color system as one of the CIE chromaticity coordinates.

TABLE 2

|  | Phosphor used | Standard deviation σ (Chromaticity x) | Standard deviation σ (Chromaticity y) |
| --- | --- | --- | --- |
| Example 6 | Example 1 | 0.002 | 0.002 |
| Example 7 | Example 2 | 0.005 | 0.004 |
| Example 8 | Example 3 | 0.008 | 0.009 |
| Example 9 | Example 4 | 0.007 | 0.009 |
| Example 10 | Example 5 | 0.004 | 0.004 |
| Comparative Example 4 | Comparative Example 1 | 0.014 | 0.016 |
| Comparative Example 5 | Comparative Example 2 | 0.011 | 0.013 |
| Comparative Example 6 | Comparative Example 3 | 0.012 | 0.011 |

It was found from the results of Examples and Comparative Examples, shown in Table 2, that the bulk density of the α-sialon phosphor was controlled in the specified range to thereby allow a LED using the phosphor to be small in variation in chromaticity.

INDUSTRIAL APPLICABILITY

The α-sialon phosphor of the invention is excited by blue light to thereby exhibit yellow to orange light emission, providing a LED smaller in variation in chromaticity than conventional one. That is, the α-sialon phosphor of the invention can be suitably used as one white phosphor for LED, which is formed by combining the phosphor with a light-emitting element using the phosphor, for example, a semiconductor light-emitting element capable of exciting for emission of blue light, and the light-emitting element can be suitably used for a light-emitting apparatus such as an illumination instrument or an image display apparatus.

The invention claimed is:

1. An α-sialon phosphor represented by general formula: $M_xEu_y(Si,Al)_{12}(O,N)_{16}$,
wherein M represents at least one or more elements selected from Li, Mg, Ca, Y and a lanthanoid (excluding La and Ce), $0.9<x<2.2$, and $0<y$,
wherein the phosphor includes, as a host crystal, a crystal structure identical to that of an α-sialon crystal phase, wherein the phosphor has a bulk density of 1.00 g/cm³ or more and 1.80 g/cm³ or less.

2. The α-sialon phosphor according to claim 1, having an angle of repose of 60° or less.

3. The α-sialon phosphor according to claim 1, wherein M in the general formula is Ca, and relationships of $1.0 \le x+y \le 2.2$ and $0<y \le 0.2$ are satisfied.

4. The α-sialon phosphor according to claim 1, wherein M in the general formula is Li, and relationships of $1.0 \le x+y\ 2.0$ and $0<y \le 0.2$ are satisfied.

5. The α-sialon phosphor according to claim 1, having an angle of repose of 30° or more.

6. The α-sialon phosphor according to claim 1, having an angle of repose of 55° or less.

7. A light-emitting element comprising the α-sialon phosphor according to claim 1, and a semiconductor light-emitting element capable of exciting the α-sialon phosphor.

8. A light-emitting apparatus comprising the light-emitting element according to claim 7.

* * * * *

UNITED STATES PATENT AND TRADEMARK OFFICE
CERTIFICATE OF CORRECTION

PATENT NO. : 11,236,269 B2
APPLICATION NO. : 17/042440
DATED : February 1, 2022
INVENTOR(S) : Yusuke Takeda et al.

It is certified that error appears in the above-identified patent and that said Letters Patent is hereby corrected as shown below:

In the Claims

Column 13, Claim 1, Line 19, "$0.9 < x < 2.2$" should be ---$0.9 \leq x < 2.2$---.

Column 14, Claim 4, Line 9, "$1.0 \leq x + y\ 2.0$" should be ---$1.0 \leq x + y \leq 2.0$---.

Signed and Sealed this
Nineteenth Day of July, 2022

Katherine Kelly Vidal
*Director of the United States Patent and Trademark Office*